United States Patent
Hopper et al.

(10) Patent No.: US 7,754,505 B1
(45) Date of Patent: Jul. 13, 2010

(54) METHOD OF FORMING A SILICON-BASED LIGHT-EMITTING STRUCTURE

(75) Inventors: Peter J. Hopper, San Jose, CA (US);
Philipp Lindorfer, San Jose, CA (US);
William French, San Jose, CA (US);
Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 106 days.

(21) Appl. No.: 12/284,290

(22) Filed: Sep. 19, 2008

Related U.S. Application Data

(62) Division of application No. 11/403,516, filed on Apr. 13, 2006, now Pat. No. 7,462,874.

(51) Int. Cl.
*H01L 21/00* (2006.01)
(52) U.S. Cl. .......................... 438/22; 438/29
(58) Field of Classification Search ............. 438/22–32, 438/E21.056, E21.351
See application file for complete search history.

(56) References Cited

U.S. PATENT DOCUMENTS

| | | | |
|---|---|---|---|
| 5,448,082 A | 9/1995 | Kim | 257/82 |
| 6,107,644 A | 8/2000 | Shakuda et al. | 257/79 |
| 6,809,340 B2 | 10/2004 | Kato et al. | 257/79 |
| 7,075,133 B1 | 7/2006 | Padmanabhan et al. | 257/276 |
| 7,154,124 B2 | 12/2006 | Han et al. | 257/88 |
| 7,375,383 B2 | 5/2008 | Nakamura et al. | 257/99 |
| 7,511,311 B2* | 3/2009 | Kususe et al. | 438/29 |

OTHER PUBLICATIONS

*Lukas W. Snyman, et al., "A Dependency of Quantum Efficiency of Silicon CMOS n+pp+LEDs on Current Density", IEEE Photonics Technology Letters, vol. 17, No. 10, Oct. 2005, pp. 2041-2043.

* cited by examiner

*Primary Examiner*—Cuong Q Nguyen
(74) *Attorney, Agent, or Firm*—Mark C. Pickering

(57) ABSTRACT

A silicon-based light emitting structure is formed as a high density array of light-emitting p-n junctions that substantially increases the intensity of the light emitted in a planar region. The p-n junctions are formed using standard CMOS processing methods, and emit light in response to applied voltages that generate avalanche breakdown and an avalanche current.

6 Claims, 6 Drawing Sheets

METHOD OF FORMING A SILICON-BASED LIGHT-EMITTING STRUCTURE

This is a divisional application of application Ser. No. 11/403,516 filed on Apr. 13, 2006 now U.S. Pat. No. 7,462,874.

BACKGROUND OF THE INVENTION

1. Field of the Invention

The present invention relates to light emitting structures and, more particularly, to a method of forming a silicon-based light-emitting structure.

2. Description of the Related Art

The vast majority of microelectronic devices are formed in silicon and, over the last several decades, a substantial effort has been directed to refining the reliability and manufacturability of these devices. As a result, silicon-based microelectronic devices have become dependable and inexpensive commodity items.

To take advantage of the existing silicon-based knowledge and infrastructure, there is a great interest in integrating active optical components into these microelectronic devices. Silicon, however, is an indirect band gap semiconductor material which, unlike a direct band gap semiconductor material, has a low photon emission efficiency. As a result, silicon is considered a poor source of electroluminescent radiation.

Although the photon-generation mechanism is not well understood, one source of visible light from silicon is a reverse biased p-n junction under avalanche breakdown conditions. Avalanche breakdown occurs when the p-n junction is reverse biased to the point of where the electric field across the junction accelerates electrons into having ionizing collisions with the lattice.

The ionizing collisions generate additional electrons which, along with the original electrons, are accelerated into having additional ionizing collisions. As this process continues, the number of electrons increases dramatically in a very short period of time, producing a current multiplication effect.

Building on this principle, Snyman, et al. in *A Dependency of Quantum Efficiency of Silicon CMOS n+pp+ LEDs on Current Density*, IEEE Photonics Technology Letters, Vol. 17, No. 10, October 2005, pp 2041-2043, have reported that the efficiency of light emission from silicon can be substantially increased by utilizing a reverse biased p-n junction with a wedge-shaped tip that confines the vertical and lateral electric field.

FIGS. 1A-1B show views of a p-n junction structure 100 that illustrate an example of the Snyman, et al. device. FIG. 1A shows a plan view, and FIG. 1B shows a cross-sectional view of structure 100 taken along lines 1B-1B. As shown in FIGS. 1A-1B, structure 100 includes a p-type semiconductor substrate 110, and an n-type well 112 that is formed in substrate 110.

In addition, structure 100 includes a p-type junction region 114 that is formed in n-type well 112, and an n-type junction region 116 that is formed in substrate 110 to contact p-type junction region 114 and form a lateral p-n junction 120. N-type junction region 116, in turn, has a tip-shape.

As further shown in FIG. 1A, structure 100 includes a pair of p-type contact regions 122 that are formed in p-type junction region 114 on opposite sides of the tip of n-type junction region 116. P-type contact regions 122 have higher dopant concentrations than p-type junction region 114. In addition, structure 100 includes a layer of silicon dioxide 124 that is formed on the top surfaces of n-type well 112, p-type junction region 114, and n-type junction region 116.

In operation, a first voltage is placed on p-type junction region 114 via p-type contact regions 122, and a second voltage is placed on n-type junction region 116. The second voltage, which is greater than the first voltage, sets up an electric field across p-n junction 120 that reverse biases junction 120.

As additionally shown in FIG. 1A, the electric field and the relative intensity of the electric field can be illustrated by a group of electric field lines 126. As shown by the electric field lines 126, the relative intensity of the electric field is significantly greater at the tip of n-type junction region 116 than it is at any of the other locations along the periphery of n-type junction region 116.

When photon emission is desired, the second voltage is increased to the point of initiating avalanche breakdown. Since the electric field is significantly greater at the tip of n-type junction region 116, the density of the avalanche current at the tip of n-type junction region 116 is also significantly greater than it is at any of the other locations along the periphery of n-type junction region 116.

As reported by Snyman, et al., structure 100 produces a significant increase in the luminescence intensity, which reached values of up to 1 nW per $\mu M^2$. The significant increase in current density at the tip of n-type junction region 116 appears to have led to the increase in luminescence intensity.

BRIEF DESCRIPTION OF THE DRAWINGS

FIG. 1A is a plan view, and FIG. 1B is a cross-sectional view of structure 100 taken along lines 1B-1B.

FIG. 2A is a semiconductor-level plan view, FIG. 2B is a metal-level plan view, FIG. 2C is a cross-sectional view taken along lines 2C-2C, and FIG. 2D is a semiconductor-level plan view with electric field lines.

FIG. 3A is a semiconductor-level plan view, FIG. 3B is a metal-level plan view, FIG. 3C is a cross-sectional view taken along lines 3C-3C, and FIG. 3D is a bottom view.

FIG. 4A is a semiconductor-level plan view, FIG. 4B is a metal-level plan view, FIG. 4C is a cross-sectional view taken along lines 4C-4C, and FIG. 4D is a bottom view.

DETAILED DESCRIPTION OF THE INVENTION

Figure 1A:
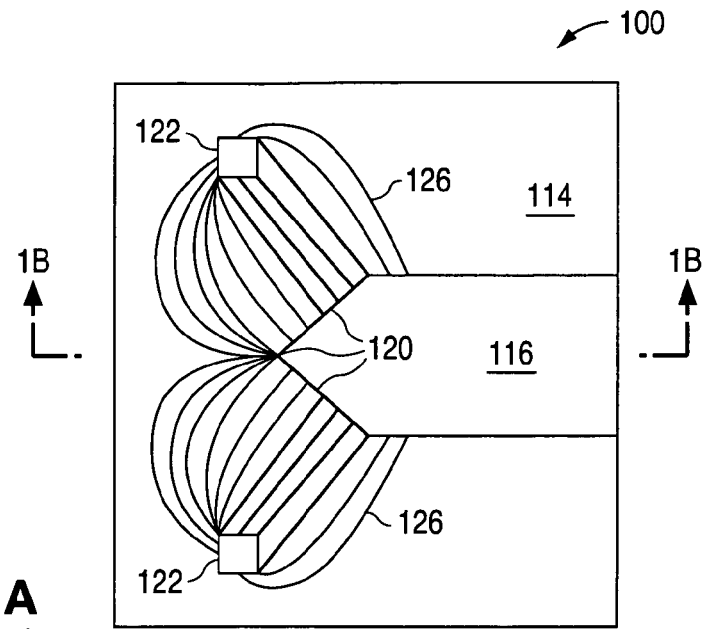
FIGS. 1A-1B are views illustrating a prior-art p-n junction structure 100.
Figure 1B:
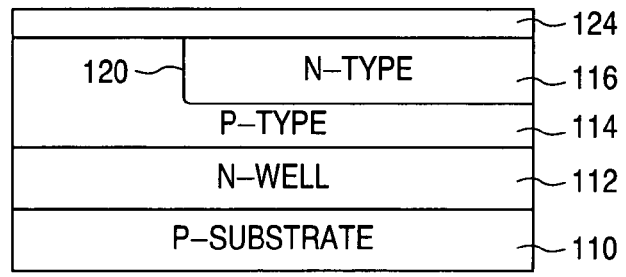
Figure 2A:
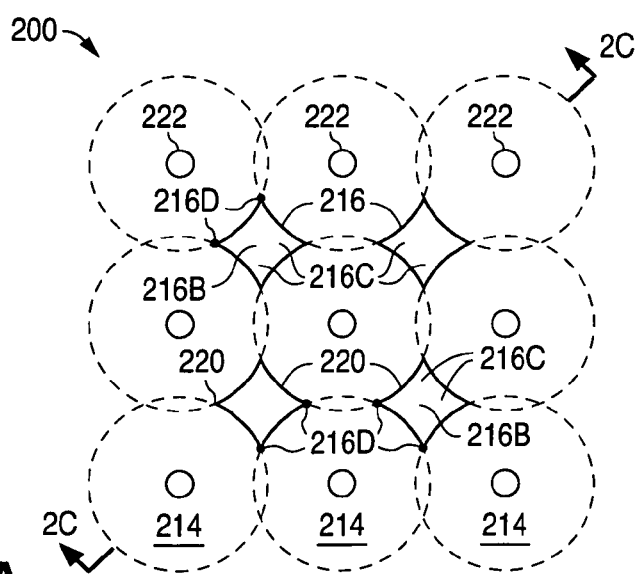
FIGS. 2A-2D are views illustrating an example of a p-n junction structure 200 in accordance with the present invention.
Figure 2B:
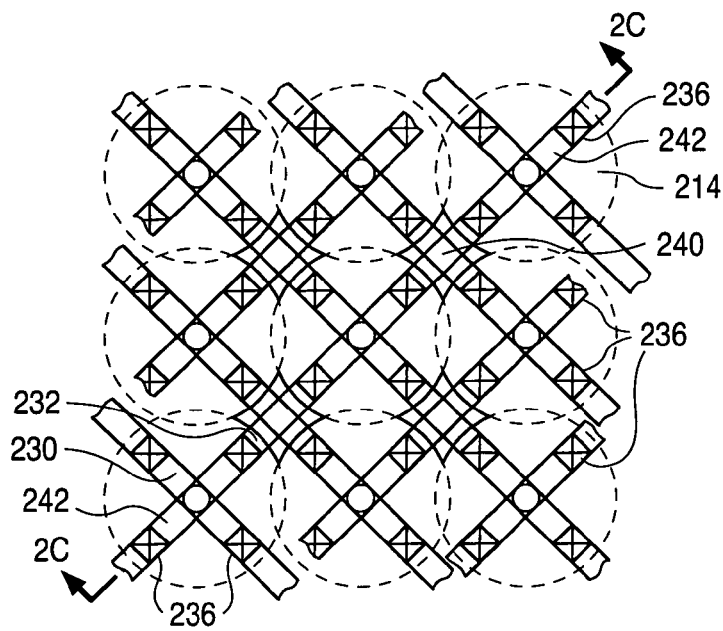
Figure 2C:
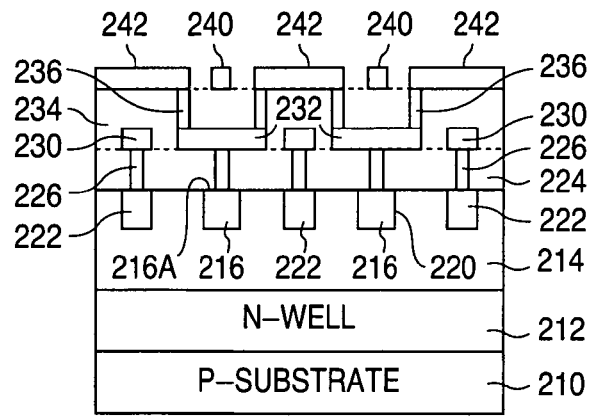
Figure 2D:
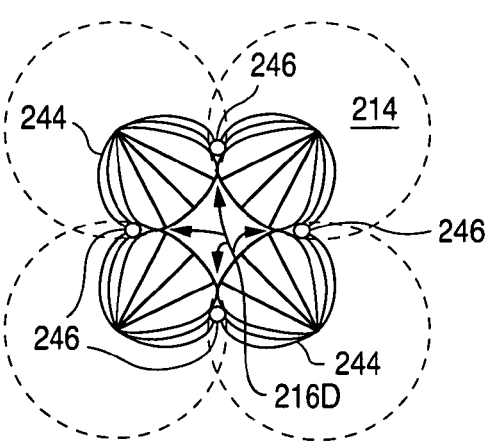

FIGS. 2A-2D show views that illustrate an example of a p-n junction structure 200 in accordance with the present invention. FIG. 2A shows a semiconductor-level plan view, FIG. 2B shows a metal-level plan view, FIG. 2C shows a cross-sectional view taken along lines 2C-2C, and FIG. 2D shows a semiconductor-level plan view with electric field lines. As described in greater detail below, the present invention describes a silicon-based high-density array of light-emitting p-n junctions.

As shown in FIGS. 2A and 2C, structure 200 includes a p-type silicon substrate 210, an n-type well 212 that is formed in substrate 210, and a p-type junction region 214 that is formed in n-type well 212. In addition, structure 200 includes a number of n-type junction regions 216 that are formed to contact p-type junction region 214.

The n-type junction regions 216 are arranged in rows and columns to form an array of regions 216. Each n-type region 216, in turn, forms a lateral p-n junction 220 with p-type junction region 214, and has a top surface 216A, a center region 216B, a number of projections 216C, and a number of points 216D. Each projection 216C extends out laterally from center region 216B, and narrows toward a point 216D. As shown in the FIGS. 2A and 2C example, each n-type junction region 216 has four projections 216C that narrow to four points 216D.

In addition, structure 200 includes a number of p-type contact regions 222 that are formed in p-type junction region 214. The p-type contact regions 222 are arranged in rows and columns to form an array of regions 222. Each p-type contact region 222 has a higher dopant concentration than p-type junction region 214. Structure 200 also includes a layer of insulation material 224, such as silicon dioxide, that is formed on the top surfaces of n-type well 212, p-type junction region 214, the n-type junction regions 216, and the p-type contact regions 222.

Further, as shown in FIGS. 2B and 2C, structure 200 includes a number of contacts 226 that are formed through insulation layer 224 to make electrical connections with the n-type junction regions 216 and the p-type contact regions 222. Alternately, a group of contacts 226, such as an array of contacts 226, can be used in lieu of a single contact 226.

In addition, structure 200 includes a number of first metal-1 traces 230 that are connected to the contacts 226 that are connected to the p-type contact regions 222, and a number of second metal-1 traces 232 that are connected to the n-type junction regions 216. The first and second metal-1 traces 230 and 232, in turn, lie orthogonal to each other.

Structure 200 further includes a layer of isolation material 234, such as silicon dioxide, that contacts isolation layer 224 and the first and second metal-1 traces 230 and 232, and a number of vias 236 that are formed through isolation layer 234 to contact the ends of the first and second metal-1 trace 230 and 232.

Structure 200 additionally includes a number of first metal-2 traces 240 that are connected to the vias 236 that are connected to the first metal-1 traces 230, and a number of second metal-2 traces 242 that are connected to the vias 236 that are connected to the second metal-1 traces 232. The first and second metal-2 traces 240 and 242 also lie orthogonal to each other.

The dopant concentrations of p-type junction region 214, the n-type junction regions 216, and the p-type contact regions 222 can be the same as the p-base layer, the n+ wedge shaped region, and the p+ contact layer, respectively, as described in Snyman, et al. in *A Dependency of Quantum Efficiency of Silicon CMOS n+pp+ LEDs on Current Density*, IEEE Photonics Technology Letters, Vol. 17, No. 10, October 2005, pp 2041-2043, which is hereby incorporated by reference.

Alternately, p-type junction region 214 can have a dopant concentration of approximately $1 \times 10^{18}$ to $1 \times 10^{18}$ atoms per $cm^2$, while n-type junction region 216 can have a dopant concentration of approximately $1 \times 10^{21}$ atoms per $cm^2$. Further, n-well 212 can have a dopant concentration of approximately $1 \times 10^{18}$ atoms per $cm^2$, and p-type contact region 232 can have a dopant concentration of approximately $1 \times 10^{21}$ atoms per $cm^2$.

In operation, a first voltage is placed on p-type junction region 214 via the p-type contact regions 222, and a second voltage is placed on the n-type junction regions 216. The second voltage, which is greater than the first voltage, sets up an electric field across each p-n junction 220 that reverse biases each junction 220.

As shown in FIG. 2D, the electric field and the relative intensity of the electric field can be illustrated by a group of electric field lines 244. As shown by the electric field lines 244, the relative intensity of the electric field is significantly greater at the points 216D of the n-type junction regions 216 than it is at any of the other locations along the periphery of n-type junction regions 216.

When photon emission is desired, the second voltage is increased to the point of initiating avalanche breakdown. Since the electric field is significantly greater at the points 216D of the n-type junction regions 216, the density of the avalanche current at the points 216D of n-type junction regions 216 is also significantly greater than it is at any of the other locations along the periphery of the n-type junction regions 216.

As a result, visible light is emitted from an emission region 246 that lies behind each point 216D. Thus, the present invention provides a manufacturable layout that substantially increases (4× in the present example) the amount of light that is emitted from a region of a silicon semiconductor.

Figure 3A:
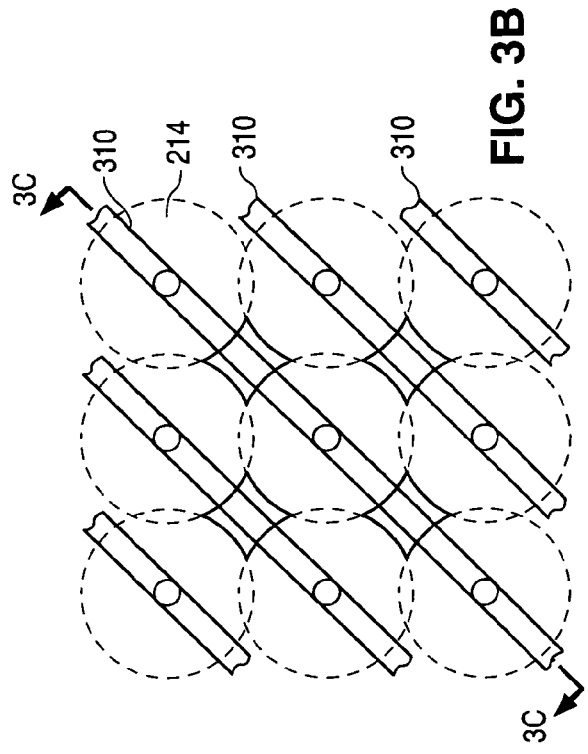
FIGS. 3A-3D are views illustrating an example of a p-n junction structure 300 in accordance with a first alternate embodiment of the present invention.
Figure 3B:
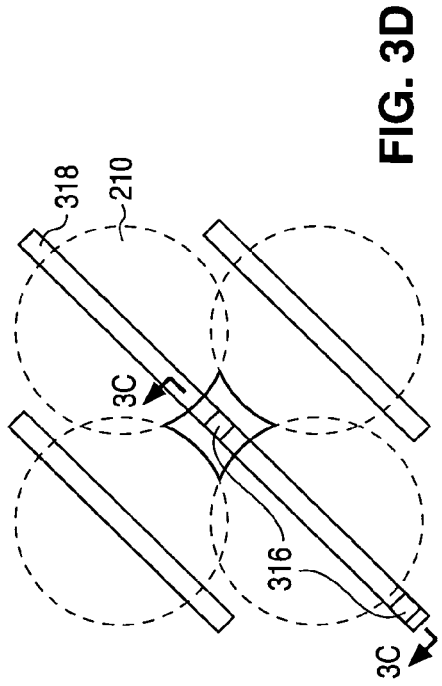
Figure 3C:
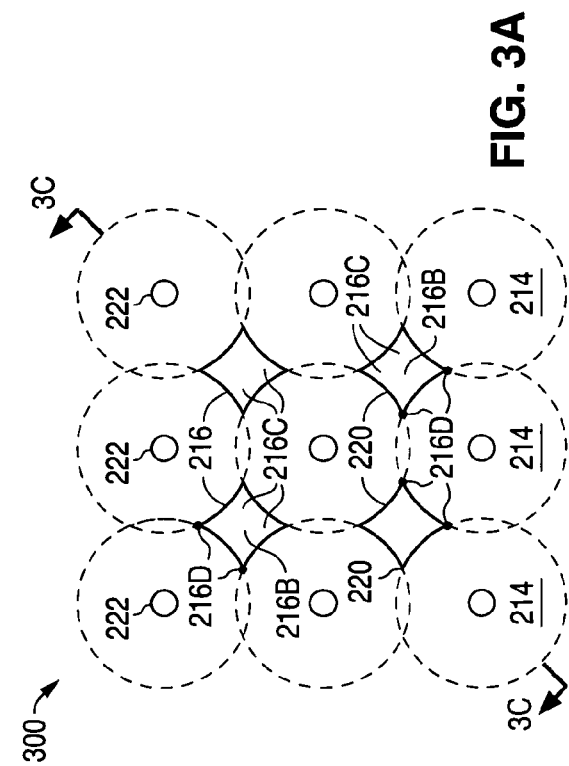
Figure 3D:
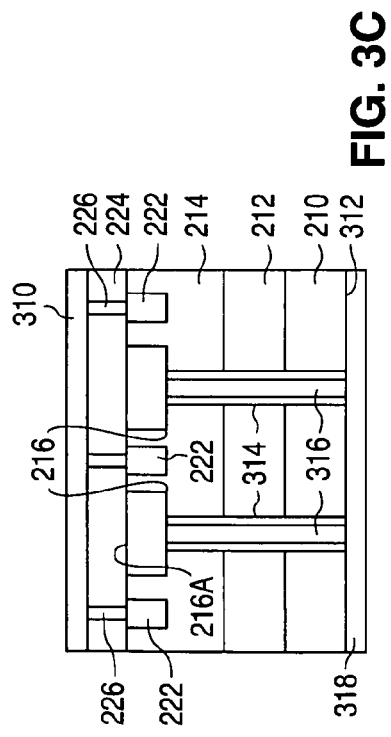

FIGS. 3A-3D show views that illustrate an example of a p-n junction structure 300 in accordance with a first alternate embodiment of the present invention. FIG. 3A shows a semiconductor-level plan view, FIG. 3B shows a metal-level plan view, FIG. 3C shows a cross-sectional view taken along lines 3C-3C, and FIG. 3D shows a bottom view.

Structure 300 is similar to structure 200 and, as a result, utilizes the same reference numerals to designate the elements that are common to both structures. As shown in FIGS. 3A-3D, structure 300 differs from structure 200 in that structure 300 has a different metal interconnect.

In lieu of the first and second metal-1 strips 230 and 232, and the first and second metal-2 strips 240 and 242, structure 300 instead has a number of metal-1 strips 310 that make electrical connections with the contacts 226 that are connected to the p-type contact regions 222. As a result, the metal interconnect formed on the top surface of structure 300 is much simpler than the metal interconnect formed on the top surface of structure 200.

Electrical connections to the n-type junction regions 216 in structure 300 are formed through the backside of substrate 210. As a result, structure 300 has a number of openings that extend from a bottom surface 312 of substrate 210, through substrate 310 to contact the n-type junction regions 216.

The side walls of each opening are lined with a layer of insulation material 314, such as silicon dioxide, and filled with a conductor 316, such as a metal, to make an electrical connection with an n-type junction region 216. In addition, structure 300 includes a number of metal-L traces 318 that contact bottom surface 312 to electrically connect together a group of the conductors 316. Alternately, in addition to the n-type junction regions 216, the p-type contact regions 222 can also be contacted through the backside.

The use of backside openings to make electrical connections to conductive regions is described in U.S. patent application Ser. No. 10/838,499 for Semiconductor Die with Heat and Electrical Pipes filed on May 3, 2004 by Gobi R. Padmanabhan et al., which is hereby incorporated by reference.

Figure 4A:
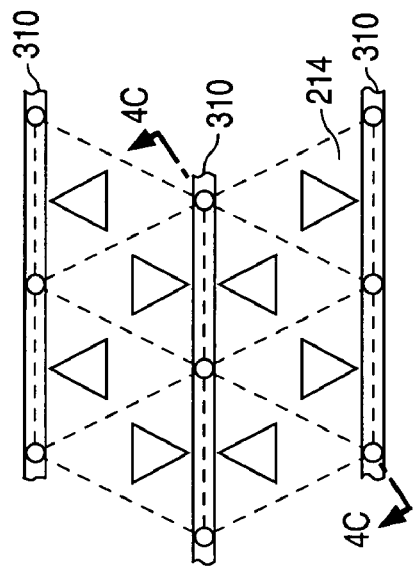
FIGS. 4A-4D are views illustrating an example of a p-n junction structure 400 in accordance with a second alternate embodiment of the present invention.
Figure 4B:
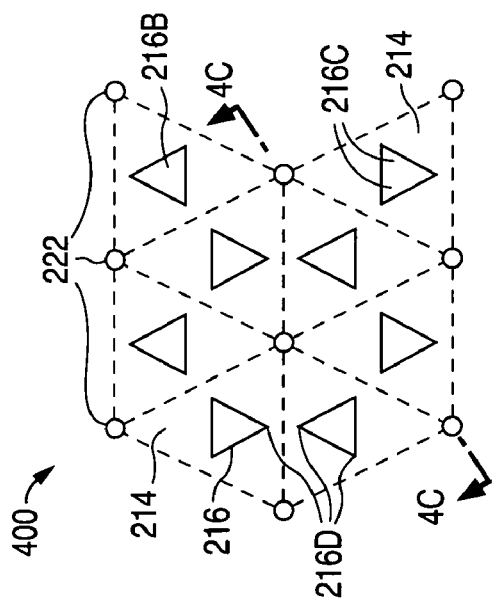
Figure 4C:
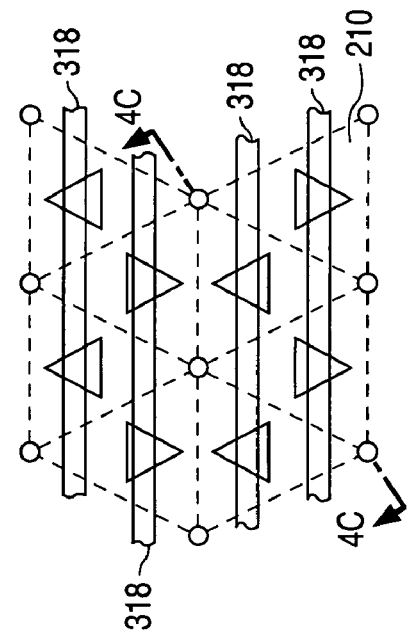
Figure 4D:
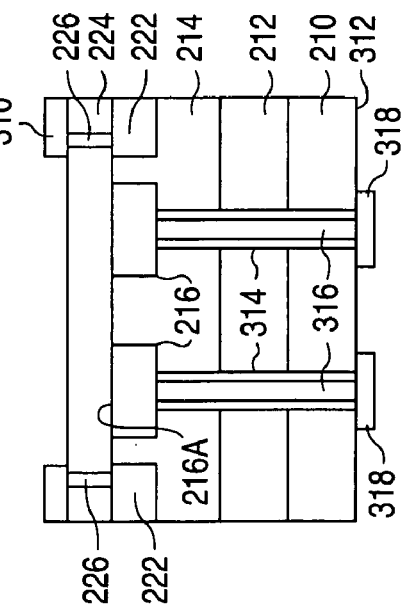

In addition to the example shown in FIGS. 2A-2D, p-n junction structures can also be formed with n-type junction regions that have a different number of points. FIGS. 4A-4D show views that illustrate an example of a p-n junction structure 400 in accordance with a second alternate embodiment of the present invention. FIG. 4A shows a semiconductor-level plan view, FIG. 4B shows a metal-level plan view, FIG. 4C shows a cross-sectional view taken along lines 4C-4C, and FIG. 4D shows a bottom view.

Structure 400 is similar to structure 300 and, as a result, utilizes the same reference numerals to designate the elements that are common to both structures. As shown in FIGS. 4A-4D example, structure 400 differs from structure 300 in that the n-type junction regions 216 of structure 400 are triangularly-shaped and have three points 216D as opposed to four.

FIGS. 5A-5E show a series of plan views that illustrate an example of a method 500 of forming a p-n junction structure in accordance with the present invention, while FIGS. 6A-6E show cross-sectional views that correspond with FIGS. 5A-5E, respectively, taken along lines 6A-6A to 6E-6E. Method 500 can be utilized to form structures 200 and 300.

Figure 5A:
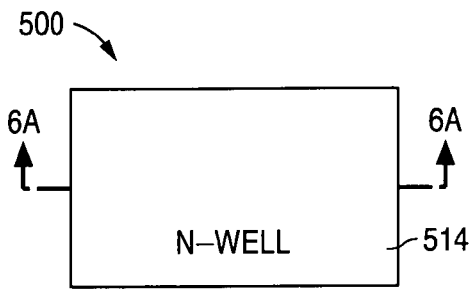
FIGS. 5A-5E are a series of plan views illustrating an example of a method 500 of forming a p-n junction structure in accordance with the present invention.
Figure 6A:
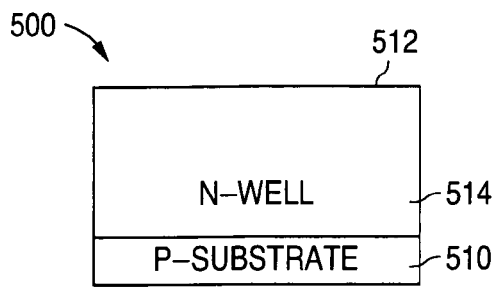
FIGS. 6A-6E are cross-sectional views that correspond with FIGS. 5A-5E, respectively, taken along lines 6A-6A to 6E-6E.

As shown in FIGS. 5A and 6A, the process utilizes a p-type, single-crystal silicon substrate 510 with a top surface 512, and begins by forming an n-type well 514 in substrate 510. An implant mask is then formed and patterned on the top surface 512 of substrate 510.

Figure 5B:
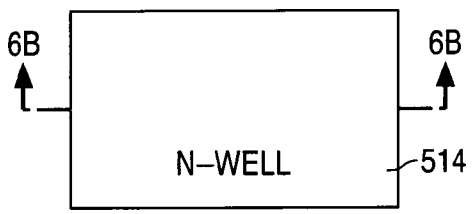
Figure 6B:
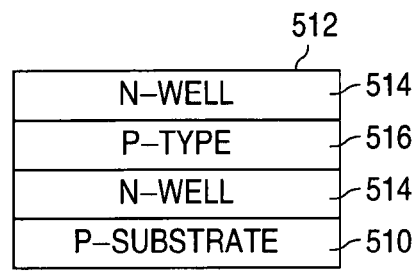

Following this, as shown in FIGS. 5B and 6B, a p-type material is implanted with a first dopant concentration at a first implant energy into substrate 510 to form a p-type region 516 in n-type well 514. P-type region 516, in turn, is located a distance below the top surface 512 of substrate 510.

Figure 5C:
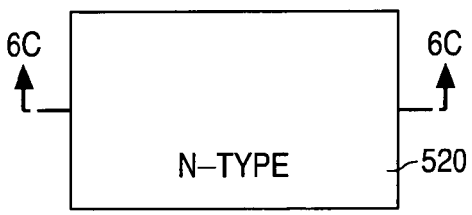
Figure 6C:
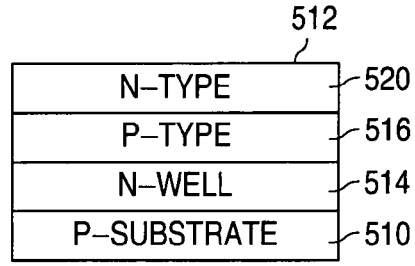

After region 516 has been formed, as shown in FIGS. 5C and 6C, an n-type material is implanted with a second dopant concentration at a second implant energy into substrate 510 to form an n-type region 520 in n-type well 512 that extends from the top surface 512 of substrate 510 down to p-type region 516. The implant mask is then removed.

Figure 5D:
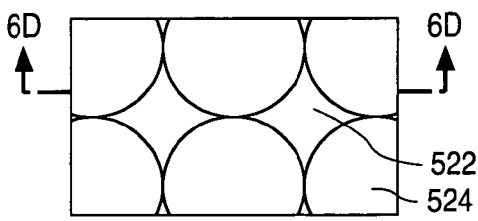
Figure 6D:
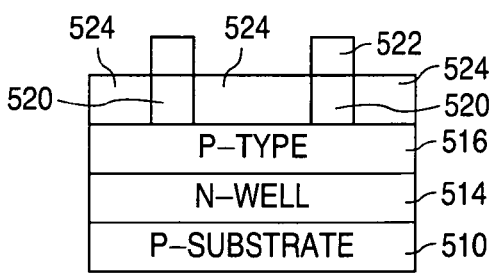

As shown in FIGS. 5D and 6D, once the implant mask has been removed, a mask 522 is formed and patterned on the top surface of substrate 510. Next, a p-type material is implanted with a third dopant concentration at a third implant energy to form a number of p-type circles 524 that are arranged in rows and columns.

The third implant energy is defined so that each circle 524 extends from the top surface of substrate 510 down to p-type region 516. The third dopant concentration is defined so that the net dopant concentration of each circle 524 (the combination of the n-well dopant, the n-type dopant of region 520, and the p-type dopant of circles 524) is approximately equal to the first dopant concentration of p-type region 516.

Circle spacing is sized to optimize light output intensity and efficiency for a specified wavelength. Design parameters and considerations include dopant concentrations, radius of curvature of each circle, contact size, metal width, and array size. The dopant concentration is controlled via implant dose, energy, species, angle, and subsequent heat cycling.

The dopant concentration target is designed so as to maximize impact ionization densities, which lead to the avalanche multiplication effect, and minimize Schockley-Read-Hall (SRH) recombination and surface recombination. SRH recombination, also known as trap assisted recombination, is a two step recombination process that emits a phonon (heat) rather than a photon. In the first step, an electron falls from the conduction band into a trap, which is an energy level within the band gap that results from an impurity or a defect in the crystalline structure. In the second step, the electron falls from the trap to the valence band.

Surface recombination, on the other hand, is a type of SRH recombination that occurs primarily at the top surface of a device as a result of dangling bonds at the interface between the crystalline structure and another material such as, for example, a region of silicon dioxide.

Further, it is believed that the effects of Auger recombination should be maximized. Auger recombination is a form of direct recombination where in some instances the recombination energy generates a photon, and in other instances the recombination energy is transferred to another electron or hole.

Figure 5E:
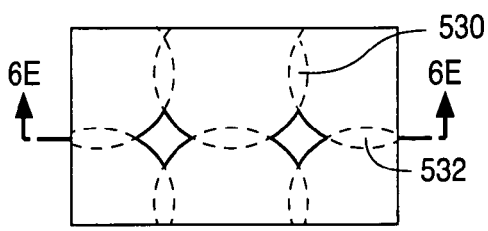
Figure 6E:
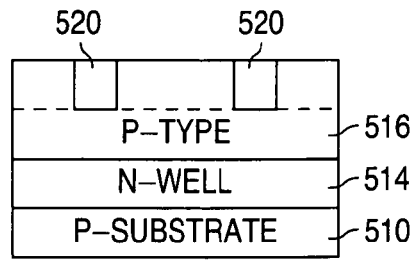

Referring again to FIGS. 5D and 6D, after circles 524 have been formed, mask 522 is removed, and substrate 510 is annealed in a neutral ambient. As shown in FIGS. 5E and 6E, the lateral diffusion of the p-type circles 524 forms a horizontal overlap region 530 between each adjacent circle 524 is each row, and a vertical overlap region 532 between each adjacent circle 524 in each column, thereby forming the projections 216C with tips that have sharp points. Conventional process steps are then followed, for example, to form the contacts, vias, and metal traces.

FIGS. 7A-7D show a series of plan views that illustrate an example of an alternate method 700 of forming a p-n junction structure in accordance with the present invention, while FIGS. 8A-8D show cross-sectional views that correspond with FIGS. 7A-7D, respectively, taken along lines 8A-8A to 8D-8D. Method 570 can be utilized to form structures 200, 300, and 400.

Figure 7A:
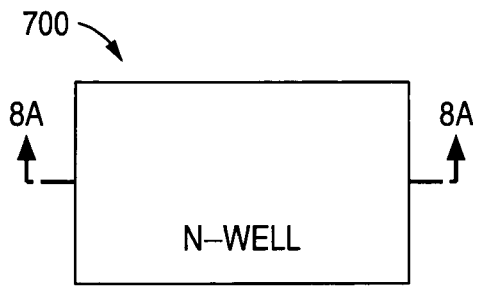
FIGS. 7A-7D are a series of plan views illustrating an example of an alternate method 700 of forming a p-n junction structure in accordance with the present invention.
Figure 8A:
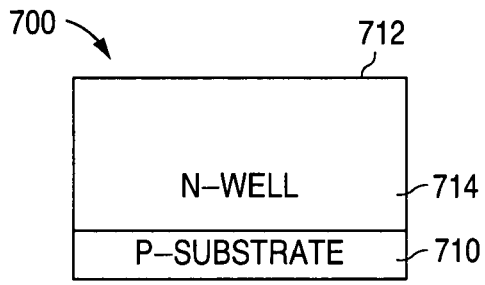
FIGS. 8A-8D are cross-sectional views that correspond with FIGS. 7A-7C, respectively, taken along lines 8A-8A to 8D-8D.

As shown in FIGS. 7A and 8A, the process utilizes a p-type, single-crystal silicon substrate 710 with a top surface 712, and begins by forming an n-type well 714 in substrate 710. An implant mask is then formed and patterned on the top surface 712 of substrate 710.

Figure 7B:
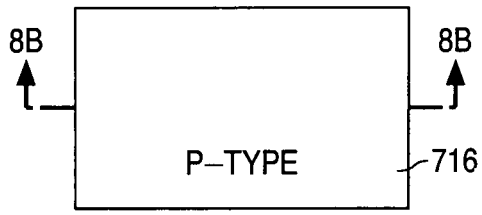
Figure 8B:
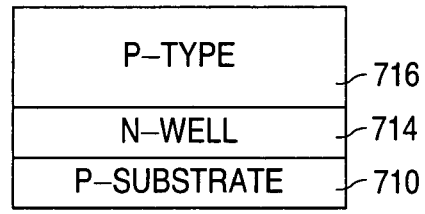

Following this, as shown in FIGS. 7B and 8B, a p-type material is implanted with a first dopant concentration at a first implant energy into substrate 710 to form a p-type region 716 in n-type well 712 that extends down from the top surface of substrate 710. The implant mask is then removed.

Figure 7C:
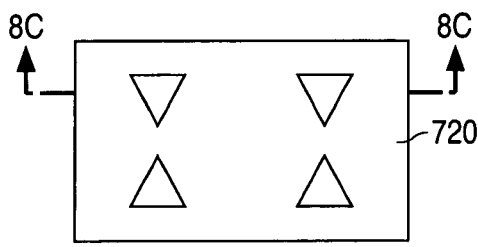
Figure 8C:
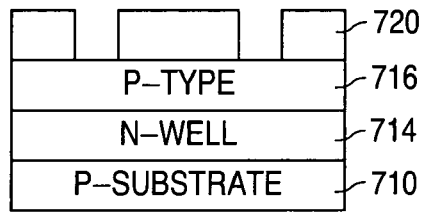

After region 716 has been formed, as shown in FIGS. 7C and 8C, a mask 720 is formed and patterned on the top surface of substrate material 710. Mask 720 can be patterned to have any desired shape, such as the four-pointed shape shown in FIG. 2A, or the three-pointed shape shown in FIG. 4A.

Figure 7D:
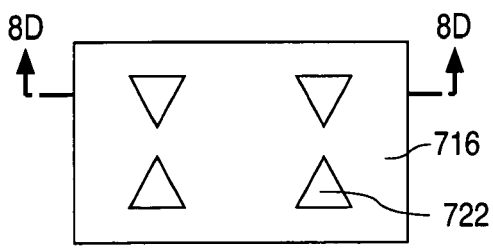
Figure 8D:
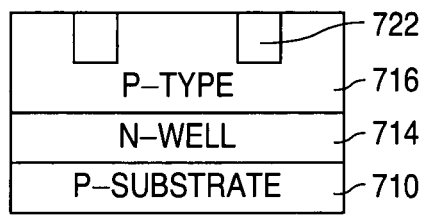

As shown in FIGS. 7D and 8D, once mask 720 has been patterned, an n-type material is implanted with a second dopant concentration at a second implant energy to form a number of n-type junction regions 722 in p-type region 716. Following this, mask 720 is removed, and substrate 710 is annealed in a neutral ambient. Conventional process steps are then followed, for example, to form the contacts, vias, and metal traces.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a light emitting structure in a semiconductor material of a first conductivity type, the semiconductor material having a top surface, the method comprising:

forming a first region of a second conductivity type in the semiconductor material; and forming a row of spaced-apart second regions of the first conductivity type in the semiconductor material, each second region having a top surface, a center region, a plurality of projections, and a plurality of points, each projection extending out laterally from the center region, and narrowing toward a point.

2. The method of claim 1 and further comprising forming a second region of the first conductivity type in the semiconductor material, the second region contacting the top surface of the semiconductor material and lying above the first region.

3. The method of claim 2 wherein forming a row includes implanting the second region with a dopant of the second conductivity type to form a row of circular regions.

4. The method of claim 3 wherein a net dopant concentration of the circular regions is approximately equal to a dopant concentration of the first region.

5. The method of claim 1 wherein the semiconductor material is single-crystal silicon.

6. The method of claim 1 wherein the second regions are formed by implanting a dopant of the first conductivity type.

* * * * *

UNITED STATES PATENT AND TRADEMARK OFFICE
CERTIFICATE OF CORRECTION

PATENT NO. : 7,754,505 B1 Page 1 of 1
APPLICATION NO. : 12/284290
DATED : July 13, 2010
INVENTOR(S) : Peter J. Hopper et al.

It is certified that error appears in the above-identified patent and that said Letters Patent is hereby corrected as shown below:

Column 4, lines 6-10, delete

"concentration of approximately $1 \times 10^{18}$ to $1 \times 10^{18}$ atoms per $cm^2$, while n-type junction region 216 can have a dopant concentration of approximately $1 \times 10^{21}$ atoms per $cm^2$. Further, n-well 212 can have a dopant concentration of approximately $1 \times 10^{18}$ atoms per $cm^2$,"

and replace with

--concentration of approximately $1 \times 10^{18}$ to $1 \times 10^{19}$ atoms per $cm^2$, while n-type junction region 216 can have a dopant concentration of approximately $1 \times 10^{21}$ atoms per $cm^2$. Further, n-well 212 can have a dopant concentration of approximately $1 \times 10^{16}$ atoms per $cm^2$,--.

Signed and Sealed this

Seventh Day of September, 2010

David J. Kappos
*Director of the United States Patent and Trademark Office*